United States Patent
Sato et al.

(10) Patent No.: US 10,488,904 B2
(45) Date of Patent: Nov. 26, 2019

(54) POWER SUPPLY CONTROLLER AND ENERGY HARVESTING APPARATUS

(71) Applicant: FUJITSU LIMITED, Kawasaki-shi, Kanagawa (JP)

(72) Inventors: Hiroyuki Sato, Kawasaki (JP); Hiroyuki Nakamoto, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 136 days.

(21) Appl. No.: 15/813,241

(22) Filed: Nov. 15, 2017

(65) Prior Publication Data
US 2018/0143675 A1  May 24, 2018

(30) Foreign Application Priority Data
Nov. 22, 2016 (JP) .................. 2016-227303

(51) Int. Cl.
| | |
|---|---|
| *G06F 1/26* | (2006.01) |
| *H01L 31/053* | (2014.01) |
| *H02J 50/05* | (2016.01) |
| *H02J 7/34* | (2006.01) |
| *H02N 11/00* | (2006.01) |

(52) U.S. Cl.
CPC .............. *G06F 1/26* (2013.01); *H01L 31/053* (2014.12); *H02J 7/345* (2013.01); *H02J 50/05* (2016.02); *H02N 11/002* (2013.01)

(58) Field of Classification Search
CPC ....................................................... H02J 7/025
USPC .................................................. 320/101, 108
See application file for complete search history.

(56) References Cited

U.S. PATENT DOCUMENTS

| | | | |
|---|---|---|---|
| 8,729,850 B2* | 5/2014 | Utsuno ...................... | H02J 7/35 320/102 |
| 2006/0094425 A1* | 5/2006 | Mickle ................. | G06K 7/0008 455/434 |
| 2013/0094261 A1* | 4/2013 | Kern ....................... | H02J 3/383 363/98 |

FOREIGN PATENT DOCUMENTS

| | | |
|---|---|---|
| JP | 08-018010 | 1/1996 |
| JP | 2016-146156 | 8/2016 |

OTHER PUBLICATIONS

"Product FAQs", FAQ:VD_0005_1.0, [Seached on May 19, 2016], Internet <URL:http://datasheet.sii-ic.com/pub/ic/speedfaq/jpn/power/vd/FVD5.PDF>, with partial English translation (2 pages).

* cited by examiner

*Primary Examiner* — Edward Tso
*Assistant Examiner* — Ahmed H Omar
(74) *Attorney, Agent, or Firm* — Fujitsu Patent Center (57) ABSTRACT

A power supply controller controlling a connection between a power source and a capacitor coupled between a first node and a second node and a load circuit operating with electric charge of the capacitor, includes a first controller configured to output a first control signal in accordance with an electric potential difference between the first node and the second node, a first switch configured to couple or uncouple the capacitor to or from the load circuit in response to the first control signal, a first resistor coupled between the first node and the first controller, a second resistor coupled between a node being located between the first resistor and the first controller and a third node for outputting the first control signal, and a second switch coupled in parallel to the first resistor and putting into on or off state in response to the first control signal.

7 Claims, 8 Drawing Sheets

POWER SUPPLY CONTROLLER AND ENERGY HARVESTING APPARATUS

CROSS-REFERENCE TO RELATED APPLICATION

This application is based upon and claims the benefit of priority of the prior Japanese Patent Application No. 2016-227303, filed on Nov. 22, 2016, the entire contents of which are incorporated herein by reference.

FIELD

The embodiments discussed herein are related to a power supply controller and an energy harvesting apparatus.

BACKGROUND

Along with miniaturization of wireless communication devices and capacity enlargement of wireless communication, internet of things (IoT) devices that each incorporate a sensor device to sense various pieces of information in a living environment and that each transmit the sensed pieces of information to a server become popular.

Usually, the IoT devices each implement therein a sensing device and a load circuit such as an integrated circuit (IC) for processing sensed data. Since power supply is desired for driving the load circuit, a battery is mounted in each of the IoT devices. In order to cause each of the IoT devices to be driven for a long period of time, it is desirable to replace a battery. However, in a case where the number of installed IoT devices is large, a considerable cost is produced for replacing batteries.

As a power source that drives the load circuit and that is different from the battery, there is an energy harvesting element such as photovoltaic power generation, which converts environmental energy into electric energy. As low power consumption of the load circuit is accelerated, an increase in power generation performance of the energy harvesting element enables an IoT device to be realized, which uses, as a power source for the load circuit, the energy harvesting element in place of the battery.

On the other hand, since being greatly influenced by a change in an environment, a power generation amount based on the energy harvesting element becomes unstable. A power supply controller for stably supplying power to the load circuit is desired for reliability improvement of the IoT device. In, for example, Japanese Laid-open Patent Publication No. 2016-146156, there is disclosed a technique in which two reset ICs to operate based on different threshold voltages are provided and in which hysteresis operations are performed at a time of an increase in a power-supply voltage and at a time of a decrease therein, thereby stabilizing power supply to the load circuit. In addition, in "product FAQs", FAQ:VD_0005_1.0, [searched on May 19, 2016], the Internet <URL:http://datasheet.sii-ic.com/pub/ic/speedfaq/jpn/power/vd/FVD5.PDF>, there is disclosed a technique for adding a resistance circuit to the outside of a reset IC, thereby widening a hysteresis. By realizing an adequate hysteresis operation, the power supply controller avoids troublesome occurrences of a connection and disconnection to and from the load circuit for a fluctuation of a value of a voltage supplied by the energy harvesting element. As a result, it is possible for the power supply controller to stabilize power supply from the energy harvesting element to the load circuit. A technique of the related art is disclosed in Japanese Laid-open Patent Publication No. 08-018010.

SUMMARY

According to an aspect of the invention, a power supply controller that controls a connection between a power source and a capacitor coupled in parallel between a first node and a second node and a load circuit that operates with electric charge supplied by the capacitor, the power supply controller includes a first controller configured to output a first control signal in accordance with an electric potential difference between the first node and the second node, a first switch configured to couple or uncouple the capacitor to or from the load circuit in response to the first control signal, a first resistor coupled between the first node and the first controller, a second resistor coupled between a node which is located between the first resistor and the first controller and a third node for outputting the first control signal, and a second switch coupled in parallel to the first resistor and configured to be put into an on-state or an off-state in response to the first control signal.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Since, in the technique of Japanese Laid-open Patent Publication No. 2016-146156, it is desirable to mount two reset ICs, a mounting area of a circuit becomes large. In addition, in "product FAQs", FAQ:VD_0005_1.0, [searched on May 19, 2016], the Internet <URL:http://datasheet.sii-ic.com/pub/ic/speedfaq/jpn/power/vd/FVD5.PDF>, a current continues flowing through the outside resistance circuit at a time of an increase in a power-supply voltage. Therefore, power consumption becomes large.

An object of the disclosed technology is to realize power supply control with a small mounting area and small power consumption.

Hereinafter, embodiments of the present technology will be specifically described.

First Embodiment

Figure 1:
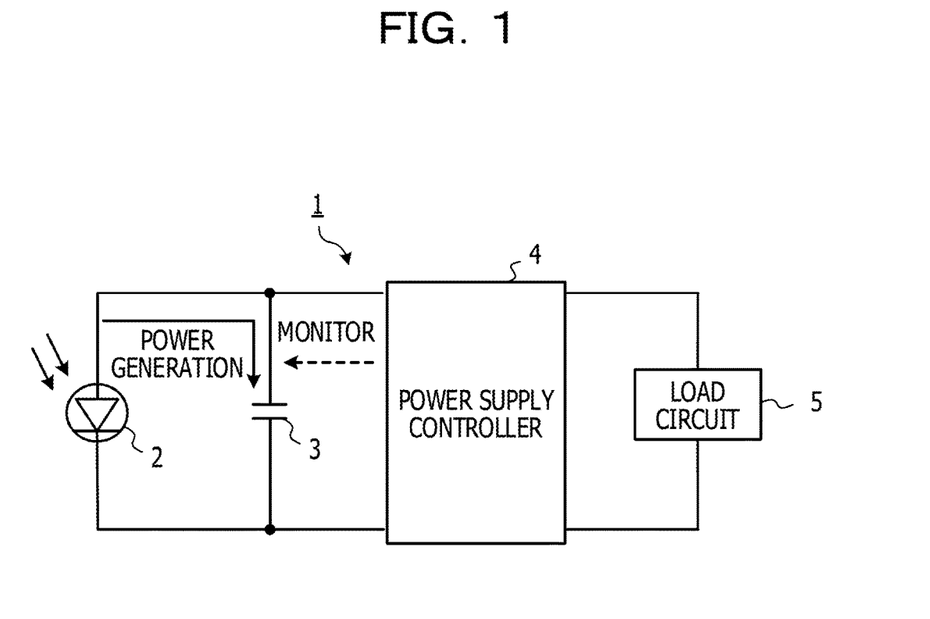
FIG. 1 is a functional block diagram illustrating an example of an energy harvesting apparatus in a first embodiment.

FIG. 1 is a functional block diagram illustrating an example of an energy harvesting apparatus in a first embodiment. In FIG. 1, an energy harvesting apparatus 1 includes an energy harvesting element 2, a capacitor 3, a power supply controller 4, and a load circuit 5. A terminal VDD and a terminal VSS are common terminals for electrically connecting the energy harvesting element 2 with other circuits.

The energy harvesting element 2 is an element that converts, into electric energy, environmental energy received from the outside of the element, thereby generating electric power. The energy harvesting element 2 functions as a current source. Examples of the energy harvesting element include a photovoltaic power generation element, a piezo element, a piezoelectric element, and so forth. The capacitor 3 is connected in parallel to the energy harvesting element 2. Since electric charge power-generated and supplied to the capacitor 3 by the harvesting element 2 is influenced by an external environment, supply power is unstable against a lapse of time. The capacitor 3 accumulates electric charge supplied by the energy harvesting element 2 and functions as a secondary battery for stabilizing electric power supplied to circuits. The electric charge accumulated by the capacitor 3 is able to be monitored as a voltage.

In accordance with a monitoring result of a voltage equivalent to the electric charge accumulated by the capacitor 3, the power supply controller 4 controls power supply to the load circuit 5.

The load circuit 5 is an IC driven by the energy harvesting element 2. The load circuit 5 is a wireless IC or a sensor device, for example. The load circuit 5 is a device that consumes low power and that is operable with electric power power-generated and supplied by the energy harvesting element 2.

Figure 2:
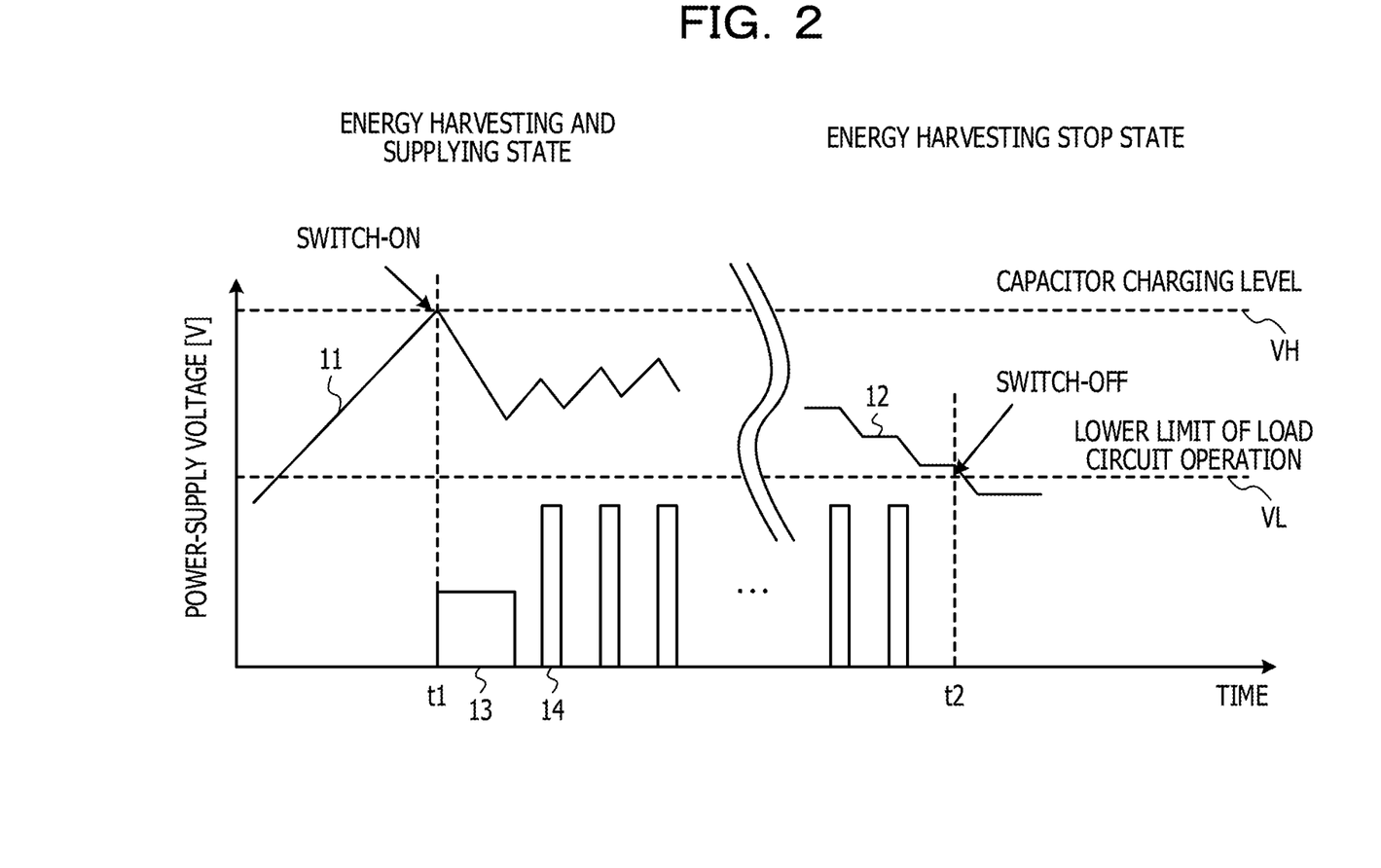
FIG. 2 is a timing chart of the energy harvesting apparatus.

FIG. 2 is a timing chart of the energy harvesting apparatus. In FIG. 2, regarding the energy harvesting apparatus 1, a waveform 11 and a waveform 12 each indicate a temporal change in a power-supply voltage value between power-supply terminals to which the capacitor 3 is connected. A waveform 13 and a waveform 14 each indicate power consumption in the load circuit 5. In each of the waveform 13 and the waveform 14, a horizontal length of a rectangle shape indicates a power consumption time period based on the load circuit 5, and a longitudinal length of the rectangle shape indicates a magnitude of power consumption based on the load circuit 5. The waveform 13 indicates power consumption in setup processing performed by the load circuit 5 and subsequent to power activation, for example. In addition, the waveform 14 indicates power consumption based on event processing operations such as sensing processing and data transmission processing after completion of setup, which intermittently occur. In a case where power consumption in the load circuit 5 occurs, the electric charge accumulated by the capacitor 3 is discharged into the load circuit 5. The power-supply voltage value is decreased in accordance with a discharge amount of electric charge of the capacitor 3.

A threshold value VH and a threshold value VL are threshold values set in the power supply controller 4. The power supply controller 4 monitors the power supply terminals of the capacitor 3 and electrically connects the capacitor 3 and the load circuit 5 to each other in a case where the power-supply voltage value becomes greater than or equal to the threshold value VH. In addition, in a case where the voltage value between the power supply terminals of the capacitor 3 becomes less than or equal to the threshold value VL after starting driving the load circuit 5, the power supply controller 4 electrically disconnects the capacitor 3 and the load circuit 5 from each other.

In a case where the energy harvesting element 2 starts electric power generation, the power-supply voltage value of the capacitor 3 starts increasing as illustrated by the waveform 11. In a case where, at a time t1, the power-supply voltage value becomes greater than or equal to the threshold value VH, power consumption based on the setup processing of the load circuit 5 occurs as illustrated by the waveform 13. While electric charge supply from the capacitor 3 to the load circuit 5 causes the waveform 11 to fall after the time t1, electric charge power-generated by the energy harvesting element 2 is supplied to the capacitor 3. After that, the waveform 11 repeats falling caused by an intermittent operation of the load circuit 5 and rising caused by electric charge supply based on the energy harvesting element 2, as illustrated by the waveform 14.

In a case where a change in the external environment causes the power generation of the energy harvesting element 2 to stop, supply of electric charge to the capacitor 3 stops. Therefore, the power-supply voltage value of the capacitor 3 decreases in association with the operation of the load circuit 5, as illustrated by the waveform 12. In a case where the power-supply voltage value illustrated by the waveform 12 becomes less than or equal to the threshold value VL at a time t2, the power supply controller 4 stops supplying electric charge from the capacitor 3 to the load circuit 5. Therefore, the load circuit 5 stops an operation. The external environment changes after the time t2, and the energy harvesting element 2 resumes the electric power generation. Accordingly, the energy harvesting apparatus 1 repeats the above-mentioned operation.

In order to cause the energy harvesting apparatus 1 to perform a stable operation, it is important to obtain a balance between a charge amount accumulated in the capacitor 3 by the energy harvesting and electric power consumed by the load circuit 5. If consumption conditions such as a power consumption time period and a charge amount in the load circuit 5 are understood beforehand, it is possible to optimize, in conformity with the consumption conditions, the threshold values VH and VL, the power generation amount of the energy harvesting element 2, and a capacity of the capacitor 3.

As described above, regardless of a change in the power generation amount of the energy harvesting element 2, associated with a change in the external environment, the power supply controller 4 is able to control so as to supply stable electric power to the load circuit 5.

Second Embodiment

Figure 3:
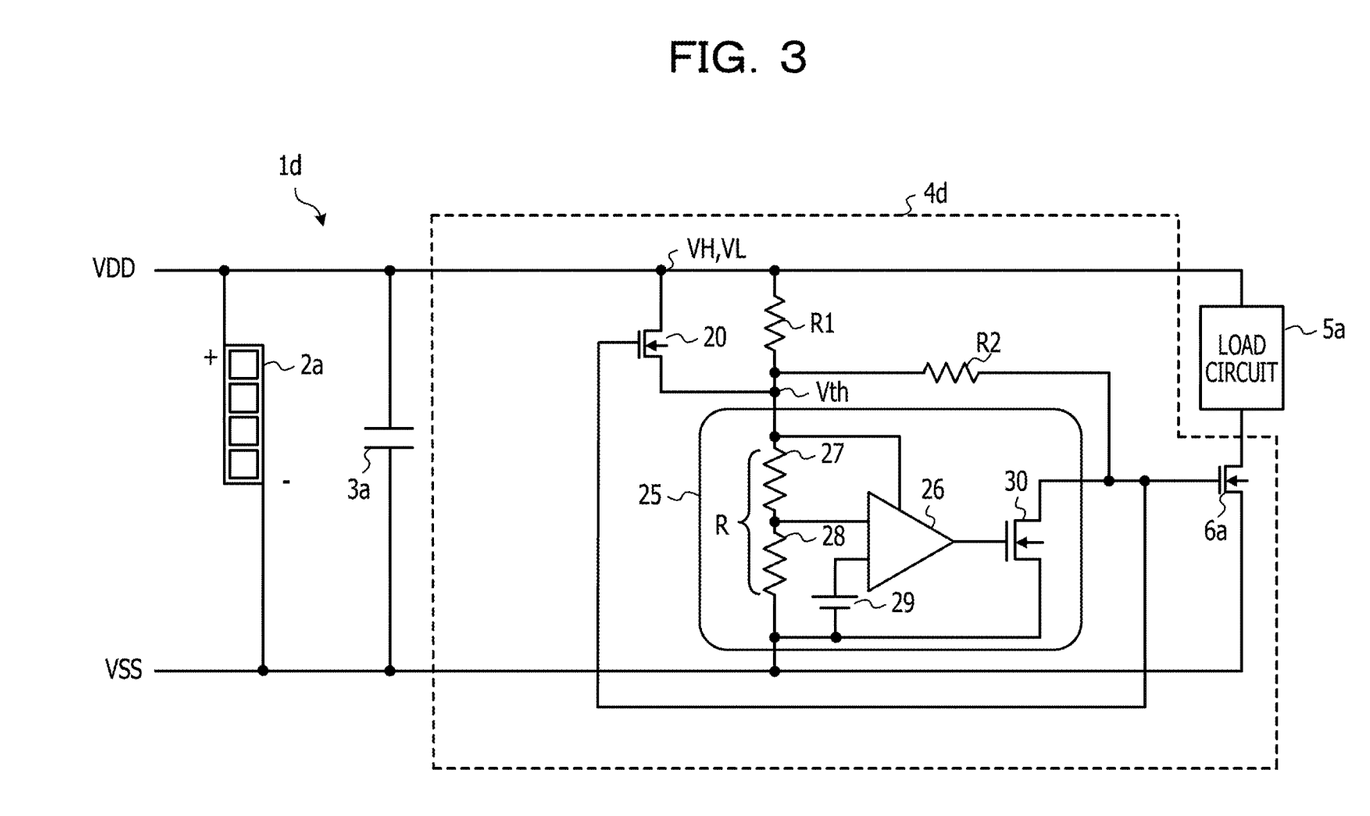
FIG. 3 is a circuit diagram illustrating an example of the energy harvesting apparatus in a second embodiment.

FIG. 3 is a circuit diagram illustrating an example of the energy harvesting apparatus in a second embodiment. In FIG. 3, an energy harvesting apparatus 1d includes a photovoltaic power generation element 2a, a capacitor 3a, a power supply controller 4d, and a load circuit 5a.

The photovoltaic power generation element 2a is one of energy harvesting elements and converts sunlight energy into electric energy. The capacitor 3a accumulates electric charge supplied by the photovoltaic power generation element 2a and functions as a secondary battery for stabilizing electric charge supplied to the load circuit.

In accordance with a monitoring result of a voltage equivalent to the electric charge accumulated by the capacitor 3a, the power supply controller 4d controls power supply to circuits. In accordance with the monitoring result, the power supply controller 4d controls an on-state and an off-state of a switch 6a.

The load circuit 5a is a circuit to which the photovoltaic power generation element 2a supplies electric power. The load circuit 5 is a wireless IC or a sensor device, for example. The load circuit 5a is a device that consumes low power and that is operable with electric power power-generated and supplied by the photovoltaic power generation element 2a.

The power supply controller 4d includes a switch 20, a resistor R1, a resistor R2, a voltage detection circuit 25, and the switch 6a.

The switch 20 is a switch element for connecting or disconnecting the terminal VDD and a terminal Vth serving as a power-supply input of the voltage detection circuit 25 to or from each other, in response to a logic level of a control signal input to the switch 6a. In FIG. 3, the switch 20 is an NMOS transistor, and a conduction state is established between a source and a drain in a case where a control signal having a high-logic level is input to a gate terminal. The resistors R1 and R2 are resistance elements having resistance values R1 and R2, respectively. A voltage value of the terminal Vth is determined depending on the resistance values R1 and R2.

The voltage detection circuit 25 is connected between the terminal Vth and the terminal VSS. The voltage detection circuit 25 is a controller that determines, in accordance with the voltage value of the terminal Vth, the logic level of the control signal to be output. The voltage detection circuit 25 includes a resistor 27, a resistor 28, a comparator 26, a voltage source 29, and a switch 30. The resistor 27 and the resistor 28 are connected in series between the terminal Vth and the terminal VSS. A total resistance value at a time of series-connecting the resistor 27 and the resistor 28 is "R". In accordance with a result of a comparison between a voltage-dividing value based on the resistor 27 and the resistor 28 and a voltage value of the voltage source 29, the comparator 26 determines the logic level of the output signal. The voltage source 29 generates a reference potential for determining a logic level of a signal to be input to the comparator 26. The switch 30 is an NMOS transistor, and an on-state is established between a source and a drain in a case where the comparator 26 inputs an output signal having a high-logic level to a gate terminal. In a case where the switch 30 is put into an on-state, the logic level of the control signal output by the voltage detection circuit 25 is put into "low".

The switch 6a is a switch element for putting an electric connection relationship between the photovoltaic power generation element 2a and the load circuit 5a into "connected" or "disconnected". In response to the logic level of the control signal output by the voltage detection circuit 25, the switch 6a switches between "connected" and "disconnected". In FIG. 3, the switch 6a is an NMOS transistor, for example, and a conduction state is established between a source and a drain in a case where the control signal having a high-logic level is input to a gate terminal.

In a case where the switch 6a is in an off-state and the voltage value of the terminal VDD is increasing, the switch 30 is put into an on-state. Therefore, current paths from the terminal VDD to the terminal VSS are a path in which a current flows through the resistors R1 and R2 and a path in which a current flows through the resistor R1 and the resistors 27 and 28. In a case where the resistance value R is considerably larger than the resistance values R1 and R2, the path in which a current flows through the resistors R1 and R2 predominates as the amount of a current that flows from the terminal VDD to the terminal VSS. Therefore, by using the voltage value Vth between the resistor R1 and the resistor R2, the threshold voltage VH satisfies VH=Vth×{R1×(R2+R)+R2×R}/{R2×R}≈Vth×(R1+R2)/R2.

In a case where the voltage value of the terminal VDD is decreasing after the switch 6a is put into an on-state, the switch 30 is put into an off-state. Therefore, a current path from the terminal VDD to the terminal VSS is a path in which a current flows through the resistor R1 and the resistors 27 and 28. In a case where the resistance value R is considerably larger than the resistance value R1, the threshold voltage VL satisfies VL=Vth×(R+R1)/R≈Vth, by using the voltage value Vth.

At a time of an increase in the voltage of the terminal VDD, the resistance values R1 and R2 are considerably smaller than the resistance value R. Therefore, power consumption at a time of an increase in the voltage increases. In a case where, in order to decrease power consumption at a time of an increase in the voltage, the resistance values R1 and R2 are decreased, the influence of the resistance values R1 and R2 on the threshold values VH and VL becomes unignorable, and it becomes difficult to ensure an adequate hysteresis operation for stabilizing a circuit operation associated with a voltage fluctuation of the terminal VDD. In addition, the amount of a current supplied to the comparator 26 is influenced by the resistor R1. Therefore, in a case of increasing the resistance value R1, a switching speed of the comparator 26 is reduced, and the voltage detection operation of the voltage detection circuit 25 becomes unstable.

Therefore, the energy harvesting apparatus 1d in FIG. 3 includes the switch 20 so as to stabilize the operation of the voltage detection circuit 25 even in a case where the resistance values of the resistors R1 and R2 are large. Hereinafter, an operation of the energy harvesting apparatus 1d at a time of a decrease in the power-supply voltage VDD will be described.

In a case where the power-supply voltage VDD increases and becomes greater than or equal to the threshold value VH, the switch 30 in the voltage detection circuit 25 is put into an off-state. In a case where the switch 30 is put into an off-state, the gate input voltage of the switch 6a becomes "high". Therefore, the gate input voltage input to the switch 20 becomes "high". The switch 20 is put into an on-state or an off-state, based on the same logic as that of the switch 6a. Therefore, in a case where the voltage level input to the switch 20 becomes "high", the switch 20 is put into an off-state.

In a case where the switch 20 is put into an on-state, a resistance value from the terminal VDD to the terminal Vth is a resistance value based on a parallel connection between the on-resistance of the switch 20 and the resistor R1. Since the on-resistance value of the switch 20 is sufficiently smaller than the resistor R1, the on-resistance value of the switch 20 predominates as the resistance value from the terminal VDD to the terminal Vth. Therefore, the switch 20 is put into an on-state at a time of a decrease in the power-supply voltage, thereby reducing the influence of the resistor R1 on the threshold voltage VL. Accordingly, it is possible to realize an adequate hysteresis operation, and it is possible to stabilize the operation of the voltage detection circuit 25.

Third Embodiment

Figure 4:
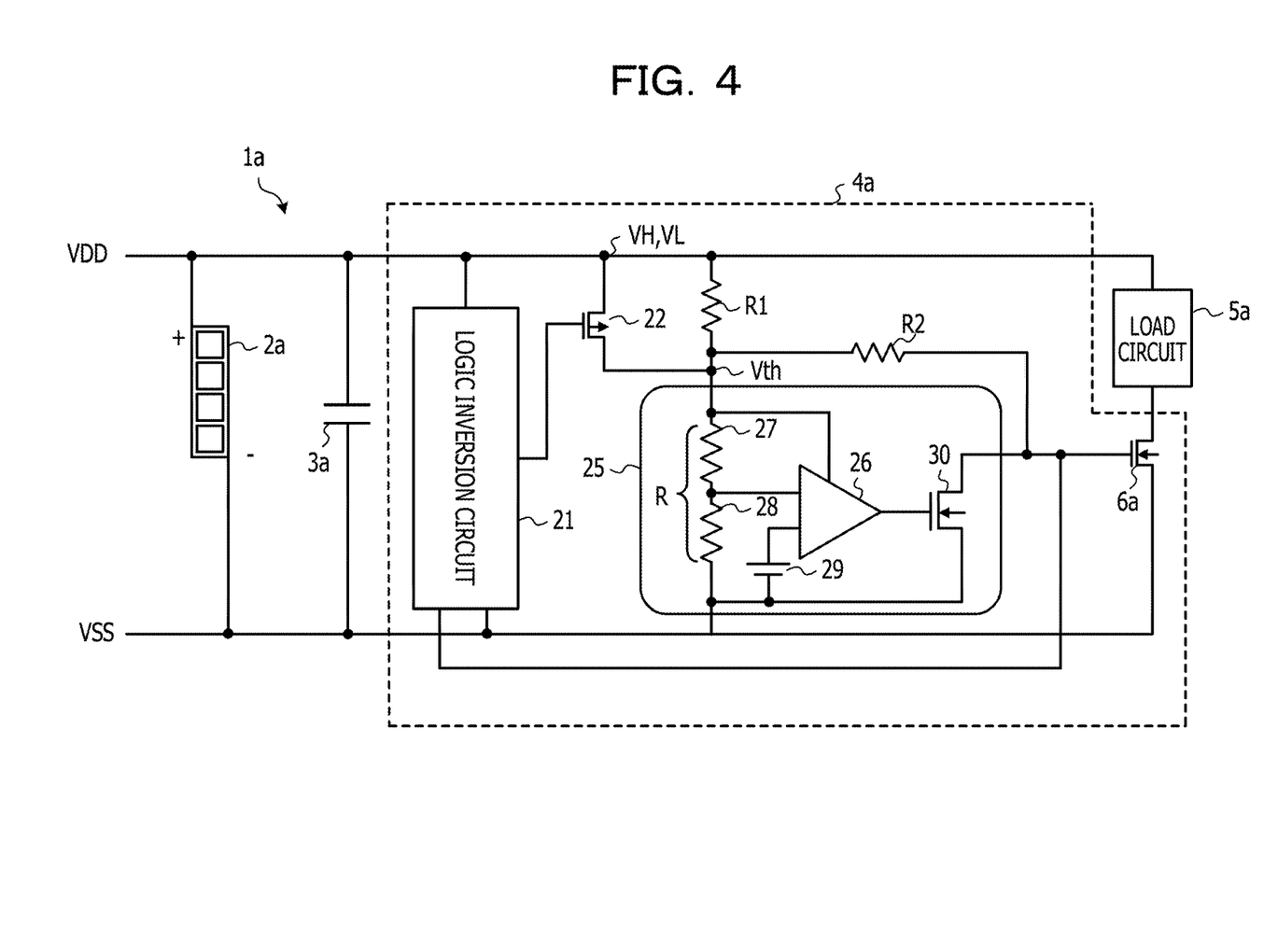
FIG. 4 is a circuit diagram illustrating an example of the energy harvesting apparatus in a third embodiment.

FIG. 4 is a circuit diagram illustrating an example of the energy harvesting apparatus in a third embodiment. In FIG.

4, an energy harvesting apparatus 1a includes the photovoltaic power generation element 2a, the capacitor 3a, a power supply controller 4a, and the load circuit 5a. Here, the same reference symbol is assigned to the same configuration item as that of another energy harvesting apparatus, and a description thereof will be omitted.

The power supply controller 4a includes a logic inversion circuit 21, a switch 22, the resistor R1, the resistor R2, the voltage detection circuit 25, and the switch 6a.

In a case where the switch 20 connected in parallel to the resistor R1 is configured by an NMOS transistor as illustrated in FIG. 3, if the logic level of the gate input voltage is "low", a source terminal is connected to the terminal Vth, and accordingly, there is a possibility that an operation is not guaranteed. In addition, in a case where the logic level of the gate input voltage is "high", if an electric potential difference between a gate and a source is small, the on-resistance value of the switch 20 is likely to increase.

Therefore, in order to further stabilize the operation of the voltage detection circuit 25 even in a case where the resistance values of the resistors R1 and R2 are large, the energy harvesting apparatus 1a in FIG. 4 includes the logic inversion circuit 21 and the switch 22. The logic inversion circuit 21 is a controller that inverts a logic level of an input signal and outputs the input signal. Hereinafter, an operation of the energy harvesting apparatus 1a at a time of a decrease in the power-supply voltage VDD will be described.

In a case where the voltage value of the capacitor 3a increases and becomes greater than or equal to the threshold value VH, the switch 30 in the voltage detection circuit 25 is put into an off-state. In a case where the switch 30 is put into an off-state, the gate input voltage of the switch 6a becomes "high". Therefore, the input voltage of the logic inversion circuit 21 becomes "high". The logic inversion circuit 21 inverts the logic of an input signal and outputs the input signal. Therefore, in a case where the input voltage is "high", a voltage level output to the switch 22 becomes "low". The switch 22 is put into an on-state or an off-state, based on a logic opposite to that of the switch 6a. Therefore, in a case where the voltage level input to the switch 22 becomes "low", the switch 22 is put into an on-state.

In a case where the switch 22 is put into an on-state, a resistance value from the terminal VDD to the terminal Vth is a resistance value based on a parallel connection between the on-resistance of the switch 22 and the resistor R1. Since the on-resistance value of the switch 22 is sufficiently smaller than the resistor R1, the on-resistance value of the switch 22 predominates as the resistance value from the terminal VDD to the terminal Vth. Therefore, the switch 22 is put into an on-state at a time of a decrease in the power-supply voltage, thereby considerably reducing the influence of the resistor R1 on the threshold voltage VL. Accordingly, it is possible to realize an adequate hysteresis operation, and it is possible to stabilize the operation of the voltage detection circuit 25. In addition, the switch 22 is configured by a PMOS transistor, and accordingly, an electric potential difference between a gate and a source at a time of an off-state is considerably increased, thereby stabilizing an off-operation. In attrition, it is possible to considerably decrease the on-resistance value at a time of an on-state, compared with the resistor R1.

Fourth Embodiment

Figure 5:
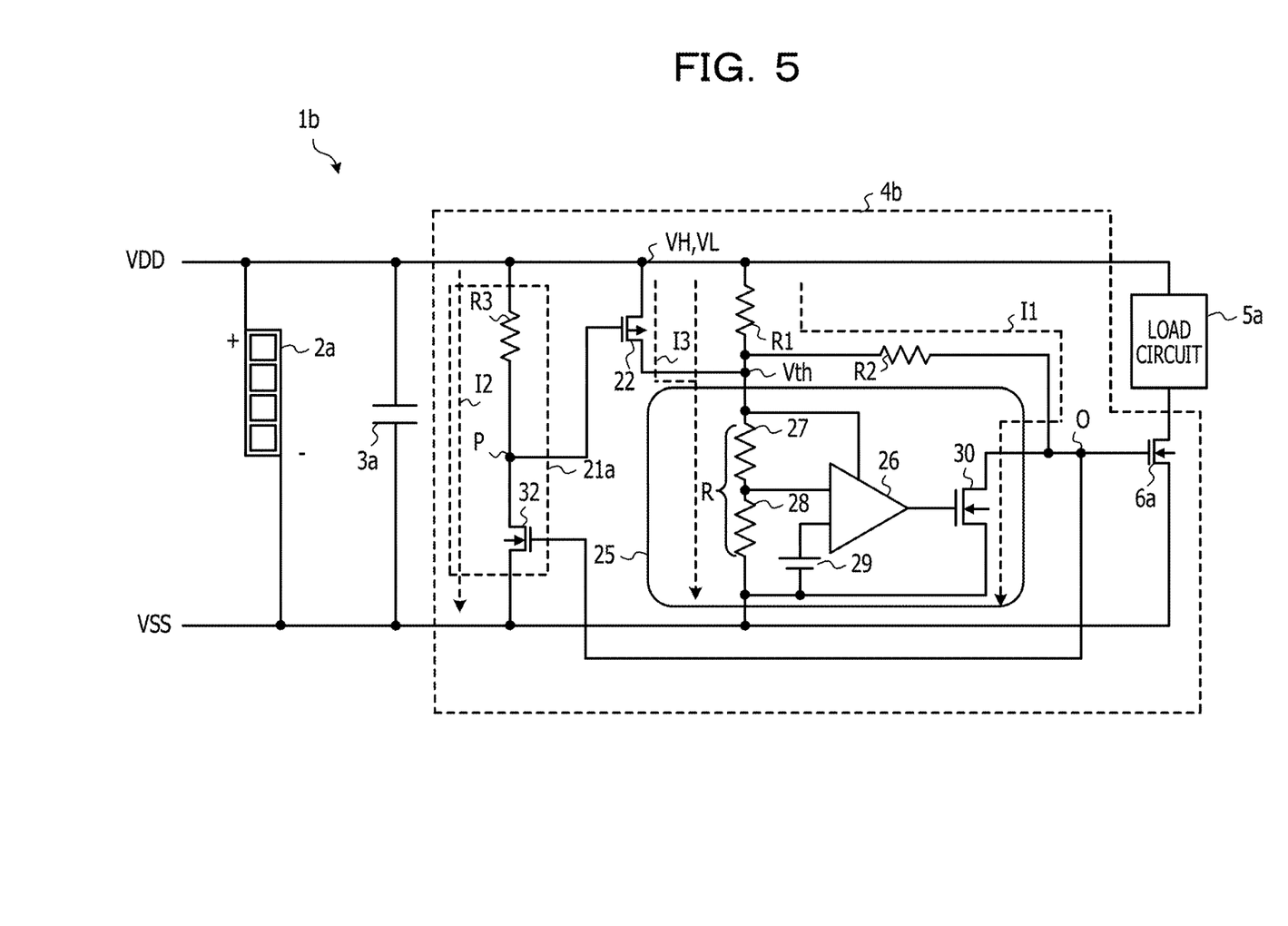
FIG. 5 is a circuit diagram illustrating an example of the energy harvesting apparatus in a fourth embodiment.

FIG. 5 is a circuit diagram illustrating an example of the energy harvesting apparatus in a fourth embodiment. In FIG. 4, an energy harvesting apparatus 1b includes the photovoltaic power generation element 2a, the capacitor 3a, a power supply controller 4b, and the load circuit 5a. Compared with the energy harvesting apparatus 1a in FIG. 4, the energy harvesting apparatus 1b in FIG. 5 includes a logic inversion circuit 21a serving as a specific example of the logic inversion circuit 21. A current I1 is a current that passes through the resistors R1 and R2 and the switch 30 and that flows from the terminal VDD to the terminal VSS. A current I2 is a current that passes through a resistor R3 and a switch 32 and that flows from the terminal VDD to the terminal VSS. A current I3 is a current that passes through a parallel circuit based on the resistor R1 and the switch 22, the resistor 27, and the resistor 28 and that flows from the terminal VDD to the terminal VSS.

The power supply controller 4b includes the logic inversion circuit 21a, the switch 22, the resistor R1, the resistor R2, the voltage detection circuit 25, and the switch 6a. The logic inversion circuit 21a includes the resistor R3 and the switch 32.

The resistor R3 is a resistance element having a resistance value R3. The resistance value of the resistor R3 may be set to a value nearly several times as large as the resistor R2. By increasing the resistance value of the resistor R3, it is possible to restrict the amount of a current that flows from the terminal VDD to the terminal VSS in a case where the switch 32 is in an on-state.

In a case where a logic level of an input signal is "high", the switch 32 is put into an on-state. The switch 32 is an NMOS transistor, for example. In a case where a logic level of an input signal of the logic inversion circuit 21a becomes "high", the switch 32 is put into an on-state, and a voltage value of a contact P drops. The contact P is an output node of the logic inversion circuit 21a. A voltage value of an output signal of the logic inversion circuit 21a is equal to the voltage value of the contact P. Therefore, in a case where the voltage value of the contact P drops, a logic level of the output signal of the logic inversion circuit 21a becomes "low". Therefore, in a case where the logic level of the input signal of the logic inversion circuit 21a is "high", the logic level of the output signal of the logic inversion circuit 21a becomes "low".

In a case where the switch 32 is in an on-state in the logic inversion circuit 21a, the amount of a current that flows from the terminal VDD to the terminal VSS depends on the resistance value of the resistor R3. In order to suppress power consumption of the energy harvesting apparatus 1b in a case where the switch 32 is in an on-state, it is desirable to considerably increase the resistance value of the resistor R3. In a case where an off-resistance value of the switch 32 is, for example, several Giga Ω in an off-state of the switch 32, if the resistance value of the resistor R3 is set to about 100 M Ω, it is possible to set the voltage value of the contact P so that a logic level for putting the switch 22 into an off-state becomes "high". In addition, in a case where the resistance value of the resistor R3 is increased, the amount of a current supplied to the switch 22 is decreased, and accordingly, a switching time of the switch 22 is lengthened. An acceptable value of the switching time depends on a starting time of activation of the load circuit 5a. In a case where it is assumed that a gate capacitance value of the switch 22 is "C1", a time constant T in switching of the switch 22 satisfies $T=1/(2\pi \times R3 \times C1)$. As described above, by taking into consideration an on-off action of the switch 22, it is possible to optimize the resistance value of the resistor R3 while considering power consumption in an on-state of the switch 32.

Figure 6A:
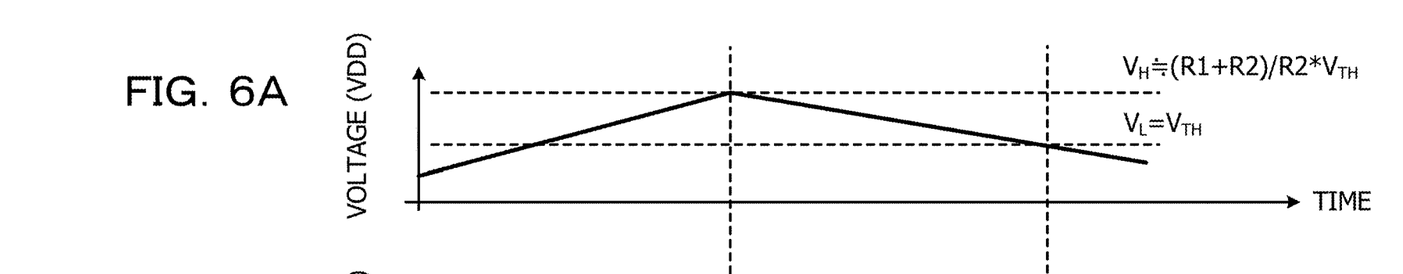
FIGS. 6A to 6C are timing charts for explaining an operation of the energy harvesting apparatus.
Figure 6B:
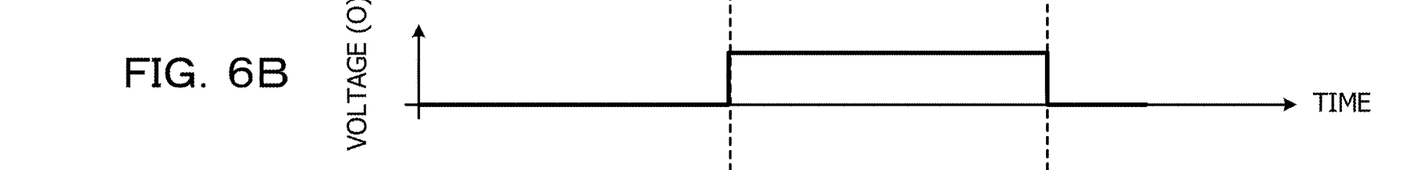
Figure 6C:
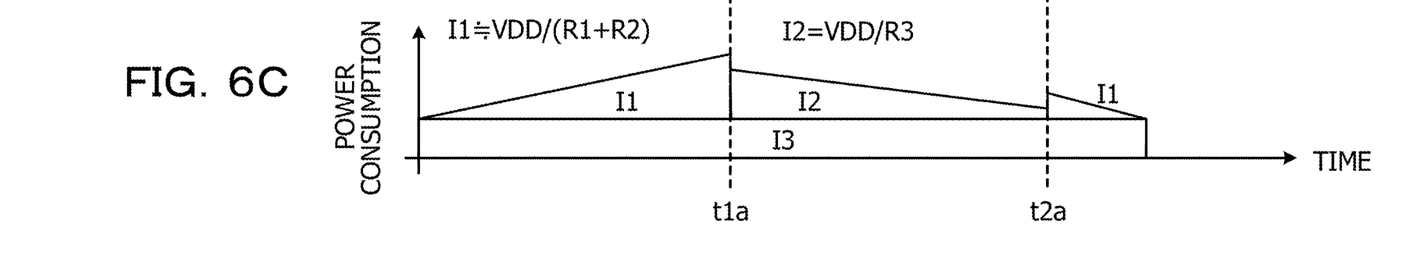

FIGS. 6A to 6C are timing charts for explaining an operation of the energy harvesting apparatus. FIG. 6A illustrates a change in voltage of the terminal VDD in the energy harvesting apparatus 1b, based on the terminal VSS. FIG. 6B illustrates a change in voltage of a contact O in the energy harvesting apparatus 1b, based on the terminal VSS. FIG. 6C illustrates a change in power consumption of the energy harvesting apparatus 1b, in other words, changes in the currents I1, I2, and I3, in the energy harvesting apparatus 1b.

The photovoltaic power generation element 2a performs electric power generation between a time 0 and a time t1a, thereby accumulating electric charge in the capacitor 3a, and the voltage value of the terminal VDD increases as illustrated in FIG. 6A. In a case where the voltage value of the terminal VDD becomes greater than or equal to the threshold value VH at the time t1a, a logic level of the contact O changes from "low" to "high", as illustrated in FIG. 6B. Since the switch 30 is in an on-state between the time 0 and the time t1a, the currents I1 and I3 flow through the energy harvesting apparatus 1b. The current I1 increases with an increase in the voltage value of the terminal VDD. On the other hand, the resistance value R of the resistor 27 and resistor 28 located in a current path of the current I3 is considerably larger than the resistance values of the resistors R1 and the resistor R2. Therefore, the current value of the current I3 is considerably smaller than that of the current I1. Therefore, compared with the current I1, the current I3 is approximately fixed, as illustrated in FIG. 6C.

In a case where the logic level of the contact O reaches "high" at the time t1a, the switch 6a is put into an on-state, and the capacitor 3a starts supplying electric charge to the load circuit 5a. At a time of supplying electric charge to the load circuit 5a, the switch 30 is put into an off-state, and the switch 32 is put into an on-state. Therefore, as illustrated in FIG. 6C, the amount of current of the current I2 predominates after the time t1a. Discharge of the capacitor 3a causes the voltage value of the terminal VDD to gradually decrease as illustrated in FIG. 6A, and the current I2 gradually decreases as illustrated in FIG. 6C.

In a case where, as illustrated in FIG. 6A, the voltage value of the terminal VDD becomes less than or equal to the threshold value VL at a time t2a, the switch 30 is put into an on-state, and the logic level of the voltage value of the contact O is switched from "high" to "low", as illustrated in FIG. 6B. The logic level of the voltage value of the contact O is put into "low", thereby putting the switch 32 into an off-state. Therefore, a path of the current I2 is disconnected as illustrated in FIG. 6C, and the current I1 predominates. Even in a case where the switch 6a is put into an off-state and electric charge supply to the load circuit 5a is stopped, the current I1 continues flowing. Therefore, the voltage value of the terminal VDD gradually decreases as illustrated in FIG. 6A, and the current value of the current I1 decreases as illustrated in FIG. 6C. In a case where a change in an environment causes the photovoltaic power generation element 2a to start electric power generation, the voltage of the terminal VDD increases again, and the energy harvesting apparatus 1b repeats the above-mentioned operation.

As described above, by providing a sufficient difference between the threshold value VH and the threshold value VL, the energy harvesting apparatus 1b is able to realize a stable hysteresis operation against a change in the power-supply voltage of the terminal VDD.

Fifth Embodiment

Figure 7:
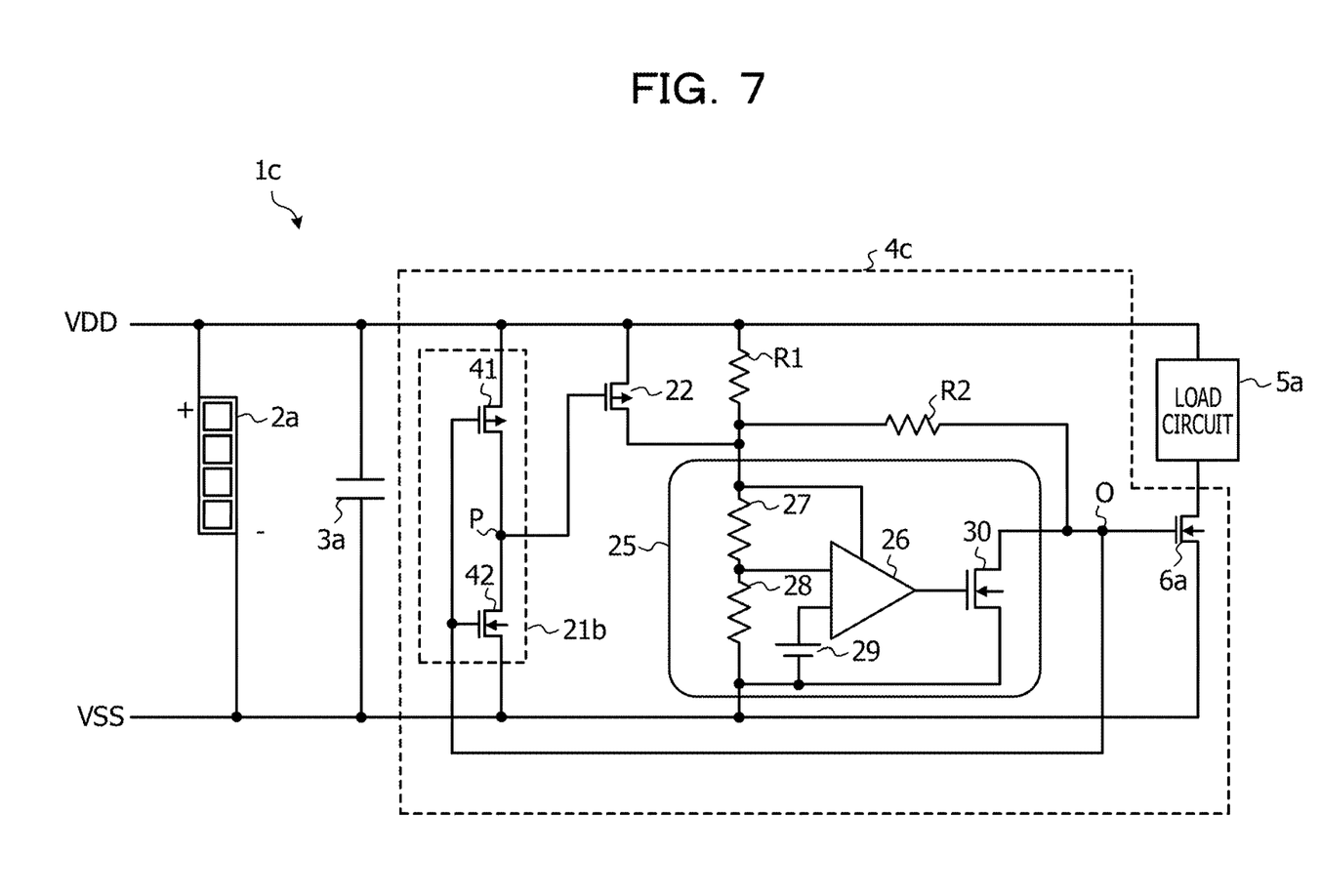
FIG. 7 is a circuit diagram illustrating an example of the energy harvesting apparatus in a fifth embodiment.

FIG. 7 is a circuit diagram illustrating an example of the energy harvesting apparatus in a fifth embodiment. In FIG. 7, an energy harvesting apparatus 1c includes the photovoltaic power generation element 2a, the capacitor 3a, a power supply controller 4c, and the load circuit 5a. Compared with the energy harvesting apparatus 1a in FIG. 4, the energy harvesting apparatus 1c in FIG. 7 includes a logic inversion circuit 21b serving as another specific example of the logic inversion circuit 21.

The power supply controller 4c includes the logic inversion circuit 21b, the switch 22, the resistor R1, the resistor R2, the voltage detection circuit 25, and the switch 6a. The logic inversion circuit 21b includes a switch 41 and a switch 42.

The switch 41 and the switch 42 are each put into an on-state or an off-state in response to the logic level of the electric potential of the contact O. The contact O is the output node of the voltage detection circuit 25. The switch 41 and the switch 42 are put into an on-state, based on respective logic levels opposite to each other. In the present embodiment, the switch 41 is configured by a PMOS transistor, and the switch 42 is configured by an NMOS transistor, for example.

In a case where the logic level of the electric potential of the contact O is "low", the switch 41 is put into an on-state, and the switch 42 is put into an off-state. In this case, the logic level of the electric potential of the contact P serving as the output of the logic inversion circuit 21b is put into "high", and the switch 22 is put into an off-state.

In a case where the logic level of the electric potential of the contact O is "high", the switch 41 is put into an off-state, and the switch 42 is put into an on-state. In this case, the logic level of the electric potential of the contact P serving as the output of the logic inversion circuit 21b is put into "low", and the switch 22 is put into an on-state.

In a case where, in the logic inversion circuit 21b in the energy harvesting apparatus 1c, the logic level of the electric potential of the contact P serving as the output of the logic inversion circuit 21b is "low", a value of a current that flows from the terminal VDD to the terminal VSS through the logic inversion circuit 21b is determined based on an off-resistance value of the switch 41. In addition, even in a case where the logic level of the output of the logic inversion circuit 21b is any one of "high" and "low", one of the switch 41 and the switch 42 is put into an off-state. Since an off-resistance value of a MOS transistor is several Giga Ω, it is possible to considerably decrease the value of the current that flows from the terminal VDD to the terminal VSS through the logic inversion circuit 21b, compared with the logic inversion circuit 21a.

Figure 8:
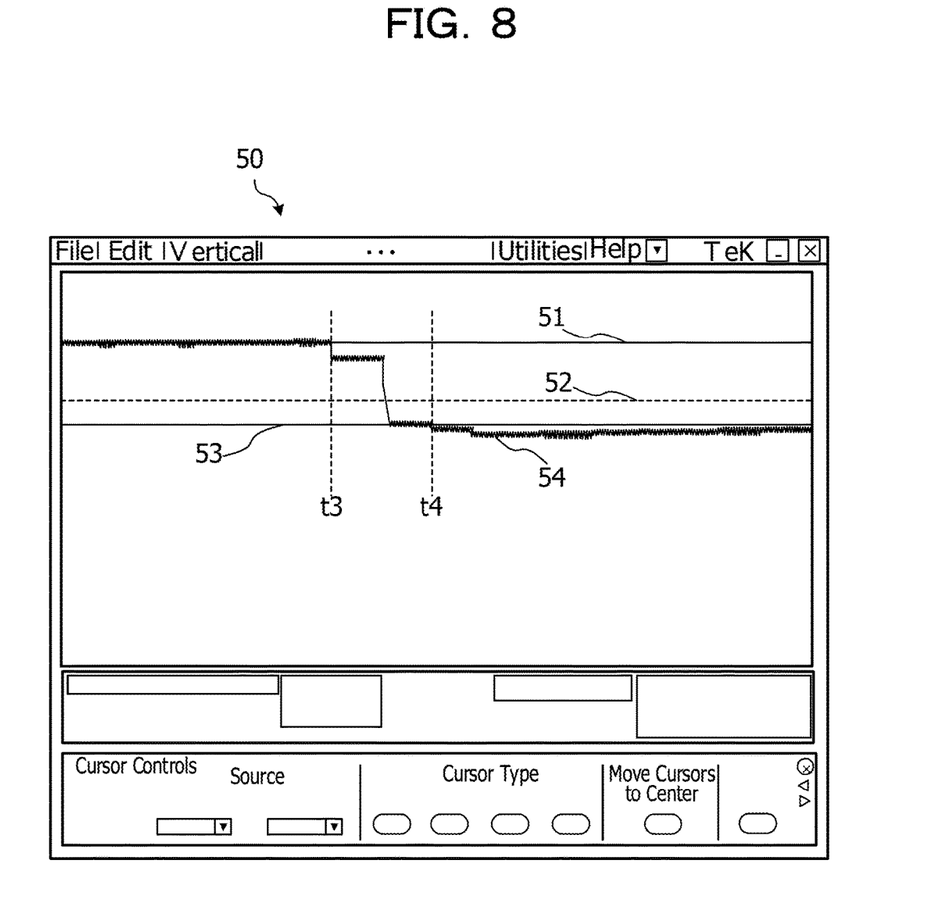
FIG. 8 is a measurement result of a power-supply voltage value of the energy harvesting apparatus of the present embodiments.

FIG. 8 is a measurement result of a power-supply voltage value of the energy harvesting apparatus of the present embodiments. A window 50 is a window of an application that displays a temporal change in a measured power-supply voltage value. A threshold value 51 is an example of the threshold value VH in the present embodiments. A threshold value 53 is an example of the threshold value VL in the present embodiments. In the present embodiment, a value of the threshold value 51 is designed to be 3.1 V, and a value of the threshold value 53 is designed to be 1.9 V. In addition, a threshold value 52 is the threshold value VL in a case where, in a power source control device, there is provided no switch that is able to connect the terminal Vth to the terminal VDD with bypassing the resistor R1 after starting power supply to the load circuit 5a. In the present embodiments, the value of the threshold value 52 is 2.4 V. In the present embodiments, as illustrated in FIG. 8, it is confirmed that, by providing a switch that is able to connect the terminal Vth to the terminal VDD with bypassing the resistor R1, it is possible to decrease the threshold value VL from 2.4 V to 1.9 V.

A waveform 54 indicates a temporal change in the voltage value of the terminal VDD in the energy harvesting apparatus of the present embodiments. At a time t3 after power supply to the load circuit is started, the voltage value of the terminal VDD starts decreasing for a reason such as stopping of energy harvesting. After that, the voltage value of the terminal VDD gradually decreases and becomes less than or equal to the threshold value 53 at a time t4. In a case where the voltage value of the terminal VDD becomes less than or equal to the threshold value VL, power supply to the load circuit is stopped. Therefore, based on the waveform 54, it is possible to confirm that a decrease in the voltage value of the terminal VDD is stopped.

As described above, based on an actual machine, it is confirmed that the energy harvesting apparatus illustrated in the present embodiments is able to realize power supply control with a small mounting area and small power consumption.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A power supply controller that controls a connection between a power source and a capacitor coupled in parallel between a first node and a second node, and a load circuit that operates with electric charge supplied by the capacitor, the power supply controller comprising:
    a first controller provided between the first node and the second node and configured to output a first control signal in accordance with an electric potential difference between the first node and the second node;
    a first switch provided between the capacitor and the load circuit, coupled to a third node to which the first control signal is output from the first controller and configured to couple or uncouple the capacitor to or from the load circuit in response to the first control signal;
    a first resistor having one first terminal coupled to the first node and the other first terminal coupled to the first controller;
    a second resistor having one second terminal coupled to the other first terminal and the other second terminal coupled to the third node; and
    a second switch coupled in parallel to the first resistor, having one third terminal coupled to the first node and the other third terminal coupled to the third node and configured to be put into an on-state or an off-state in response to the first control signal.

2. The power supply controller according to claim 1, further comprising:
    a second controller configured to output a second control signal obtained by inverting a logic of the first control signal, wherein the second switch is put into an on-state or an off-state in response to the second control signal.

3. The power supply controller according to claim 1, wherein the first controller includes a third resistor and a fourth resistor connected in series between the first resistor and the second node, a comparator configured to output a third control signal in accordance with a result of a comparison between an electric potential at a contact between the third resistor and the fourth resistor and a preset reference potential, and a third switch connected between the third node and the second node and configured to be put into an on-state or an off-state in response to the third control signal.

4. The power supply controller according to claim 2, wherein the second controller includes a fifth resistor connected between the first node and a fourth node to output the second control signal, and a fourth switch connected between the fourth node and the second node and configured to be put into an on-state or an off-state in response to the first control signal.

5. The power supply controller according to claim 2, wherein the second controller includes a fourth switch connected between the fourth node and the second node and configured to be put into an on-state or an off-state in response to the first control signal, and a fifth switch connected between the fourth node and the first node and configured to be put into an on-state or an off-state in response to the first control signal, based on a logic opposite to that of the fourth switch.

6. A power supply controller that controls a connection between a power source and a capacitor connected in parallel between a first node and a second node and a load circuit that operates with electric charge supplied by the capacitor, the power supply controller comprising:
    a controller provided between the first node and the second node and configured to output a control signal which is logic inverted in accordance with an electric potential difference between the first node and the second node;
    a first switch provided between the capacitor and the load circuit, coupled to a third node to which the control signal is output from the controller and configured to connect or disconnect the capacitor and the load circuit to or from each other in response to a logic of the control signal;
    a first resistor having one first terminal coupled to the first node and the other first terminal coupled to the controller and configured to restrict current supply from the first node to the controller;
    a second resistor having one second terminal coupled to the other first terminal and the other second terminal coupled to the third node; and
    a second switch connected in parallel to the first resistor, having one third terminal coupled to the first node and the other third terminal coupled to the third node and configured to connect or disconnect the first node and the controller to or from each other in response to the logic of the control signal,
    wherein in a case where the controller outputs the control signal having a logic for putting the first switch into a connection state, the second switch is put into a connection state.

7. An energy harvesting apparatus comprising:
    an energy harvesting device coupled between a first node and a second node; a capacitor coupled in parallel to the energy harvesting device;
    a load circuit configured to operate with electric charge supplied by the capacitor;
    a first controller provided between the first node and the second node and configured to output a first control signal in accordance with an electric potential difference between the first node and the second node;

a first switch provided between the capacitor and the load circuit, coupled to a third node to which the first control signal is output from the first controller and configured to couple or uncouple the capacitor to or from the load circuit in response to the first control signal;

a first resistor having one first terminal coupled to the first node and the other first terminal coupled to the first controller;

a second resistor having one second terminal coupled to the other first terminal and the other second terminal coupled to the third node; and a second switch coupled in parallel to the first resistor, having one third terminal coupled to the first node and the other third terminal coupled to the third node and configured to be put into an on-state or an off-state in response to the first control signal.

* * * * *